United States Patent [19]

Plesko

[11] Patent Number: 5,469,291
[45] Date of Patent: Nov. 21, 1995

[54] GYRATING PROGRAMMABLE SCANNER

[75] Inventor: George A. Plesko, Media, Pa.

[73] Assignee: Gap Technologies, Inc., Media, Pa.

[21] Appl. No.: 6,754

[22] Filed: Jan. 21, 1993

Related U.S. Application Data

[63] Continuation-in-part of Ser. No. 612,983, Nov. 15, 1990, Pat. No. 5,187,612.
[51] Int. Cl.$^6$ ................................................... G02B 26/08
[52] U.S. Cl. .......................... 359/224; 359/199; 359/213; 359/872; 310/36; 310/46; 235/467
[58] Field of Search ................................. 359/213–214, 359/221, 223–226, 196–200, 212, 220, 872; 310/36, 40 R, 66, 75 A, 75 R, 273, 46, 90.5; 318/119; 335/220, 229, 298–299; 185/45; 235/462, 467; 250/234–236; 348/205

[56] References Cited

U.S. PATENT DOCUMENTS 4,364,000 12/1982 Burke, Jr. ........................ 359/214
4,878,721 11/1989 Paulsen ........................... 359/214

*Primary Examiner*—Loha Ben
*Assistant Examiner*—James Phan
*Attorney, Agent, or Firm*—Eugene E. Renz, Jr.

[57] ABSTRACT

A device for providing angular displacement of an axis in a direction selected from the X or Y direction or rotational movement about the Z direction with respect to the axis. The device comprises a magnetic core element which produces a magnetic field and defines a Z axis. The core element is capable of displacement in the X and Y directions respectively, and also rotational movement about the Z axis. A coil device proximate the core element introduces a distortion force in the core element in at least one of the X and Y directions or about the Z axis as desired a mounting device suspends the core element with respect to the coil device to permit relative movement therebetween in response to the distortion force.

29 Claims, 14 Drawing Sheets

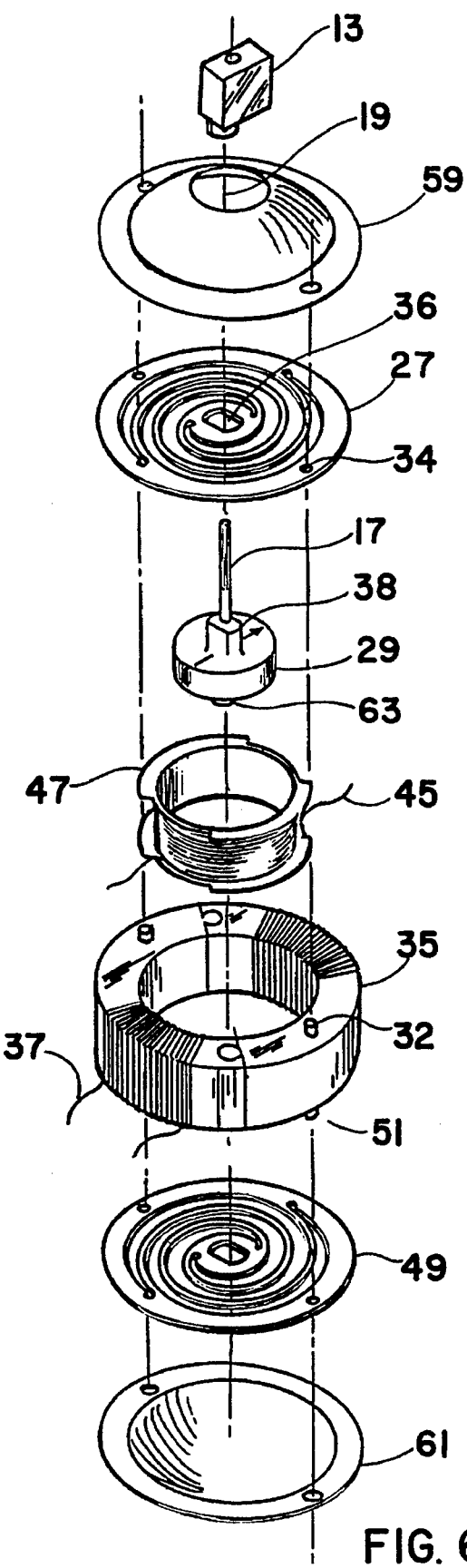
FIG. 6
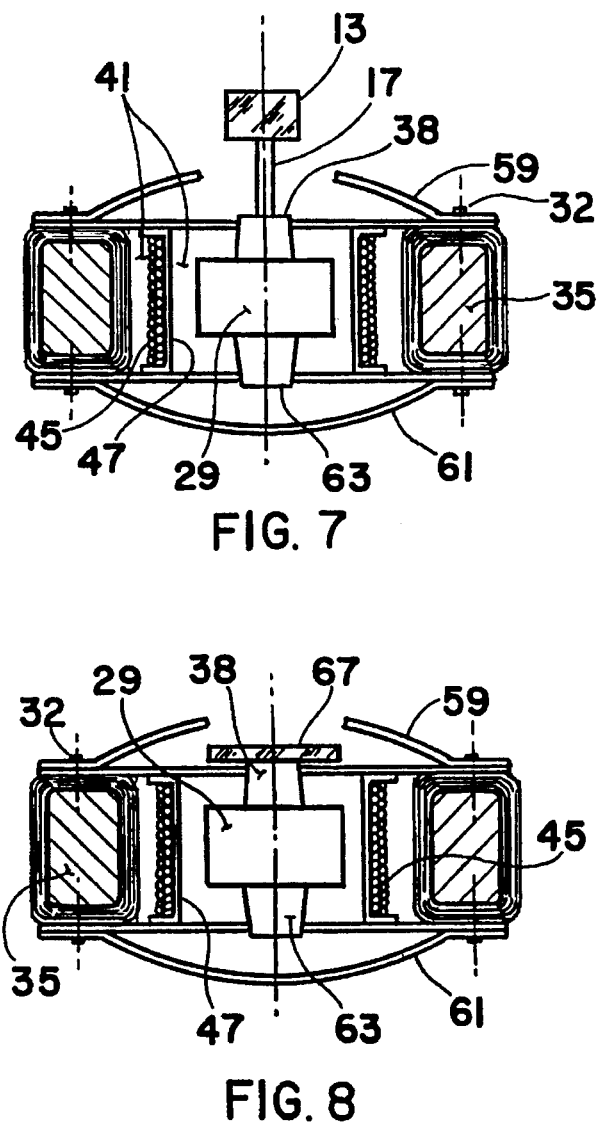
FIG. 7
FIG. 8

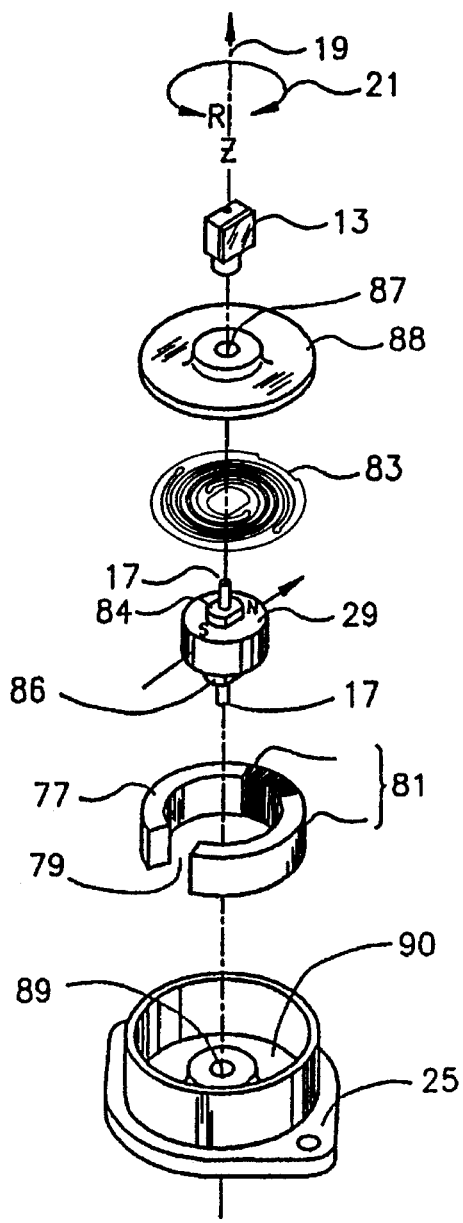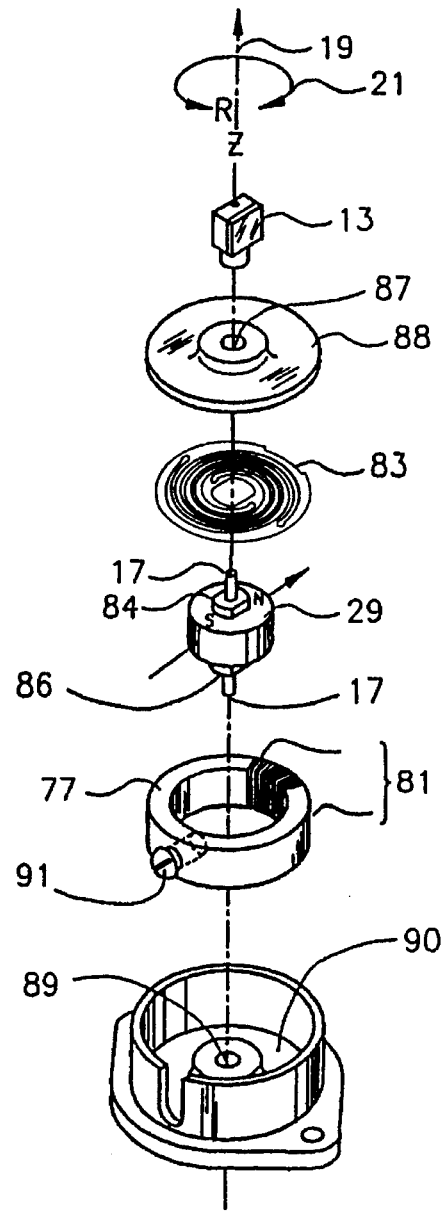
Fig. 13
Fig. 15

GYRATING PROGRAMMABLE SCANNER

This a Continuation In Part Application of patent application Ser. No. 07/612,983 filed Nov. 15, 1990, now U.S. Pat. No. 5,187,612.

TECHNICAL FIELD

The present invention relates to a device for providing movement on an axis in at least one direction selected from the rotational direction and the x or y direction. More particularly, the invention relates to a device suitable for controlling the movement of a beam of light, such as from a laser, to generate two dimensional repeating patterns of light. In one embodiment, the invention is useful as a scanner for moving a small spot of light across bar codes in order to read them.

BACKGOUND ART

Scanners are devices which are used to control the movement of a beam of light, such as from a laser. The scanners are employed to aim optical elements such as mirrors, lenses and the like in order to reflect, collect and focus light. Scanners have found extensive application in the bar code industry. Bar codes consist of alternating light and dark bars which are used to present price or other information. One conventional method for reading them is to scan a focused beam of light in a line across the entire code. As light is absorbed and scattered by the bars, the resulting light modulation may be detected by a photodiode, for example, and processed by an electronic cash register or computer terminal.

In hand held bar code reading equipment compactness and simplicity of the scan mechanism are essential so the equipment can be portable. Single straight line scans are the simplest to generate and thus are often used in such equipment.

Orientation of the scanning beam with respect to the bar code is required however and this can slow down the reading process in either portable or fixed mount scanners. Various systems have therefore been devised to automatically scan a beam in multiple directions to overcome the need for tedious orientation.

U.S. Pat. No. 4,387,297 disclosed a portable scanning system in which a pair of motors and multiple drives are used to generate an omnidirectional pattern. Refinements of this device have not yet obviated the inherent clumsiness and size of the device due to the multiple drives and other equipment. Another beam scanning type device, shown in U.S. Pat. No. 4,639,070, uses an involved gear system for rotating various elements of the device. It also is quite complicated to manufacture.

U.S. Pat. No. 4,041,322 describes a device in which there is an angular displacement of a mirror in a single plane and at a constant speed. Several mirrors are used to provide the scanning signal at various angles.

U.S. Pat. No. 4,494,024, describes a spring activated motor, but it is a "one shot" spring driven motor in which heat is used to release torque by severing a chord. U.S. Pat. No. 3,631,274 describes a power supply in which a spring induces a voltage pulse in the coil.

U.S. Pat. No. 4,388,651 describes the faults of the prior art, stating that it is characterized generally by considerable complexity or by limited performance. This patent proposes to solve the problem using a single, small diameter rotating polygon mirror which is described as having increased scan efficiency by reflecting a beam from the polygon mirror facets two separate times. Examples of other systems are shown in U.S. Pat. No. 4,794,237, which employs a plurality of mirrors and a rotating disc, and in U.S. Pat. No. 4,795,224 which requires several motors and a relatively complicated prism ring which refracts light.

None of the prior art has yet been able to generate an appropriate optical pattern of lines to read bar codes at any orientation. Moreover, no prior art device has been found to produce omnidirectional scan patterns with a single optical element. Ideally, such a device would be small and very rapid, and could be held in one hand if constructed as a raster or omnidirectional device. It is desirable that the device be programmable to present one or more than one pattern of light with the fewest possible parts.

It is an object of this invention to provide a device for providing movement on an axis, such that a mirror can be attached to that axis, in order to impart combinations of rotational and x or y movement. Preferably the device imparts both movements, in order to generate a two dimensional scanning pattern produced by light reflected off on the mirror.

It is a particular object of the present invention to produce laser scan patterns which greatly reduce or eliminate the need for special orientation of either the bar code or the scanner in bar code reading equipment.

Yet another object is to provide a scanner which is programmable and yet which is small and compact, and which operates at low power.

In it broadest form, the object of this invention is to provide a means for aiming or positioning an optical element in synchronization with electronic signals, which may be produced by oscillators, computers, music, voice, and the like, for information gathering or demonstration or entertainment purposes.

Other objects will appear hereinafter.

DISCLOSURE OF INVENTION

It has now been discovered that the above and other objects of the present invention have been accomplished in the manner described below. Specifically, the invention relates to a device for providing movement on an axis in at least one direction selected from the x or y direction and the rotational direction, and preferably in several directions, preferably simultaneously.

The device includes a shaft member having an axis defining a rotational direction about the axis of the shaft. A magnetic core means is mounted on the shaft and centers the shaft on the axis. The shaft itself may extend in one or both directions axially or may be the center of the core. The core generates a magnetic field in a plane which defines x and y coordinates with respect to the axis. Also included is a ferromagnetic ring surrounding the core and aligned in the plane described above. The ring has a coil means for receiving a varied electric current in the coil which is wrapped about the ring. The ring is positioned to provide a low reluctance path for the magnetic field and the magnetic field is aligned to penetrate only one side of the coil. Finally, means are provided for suspending the core with respect to the coil to permit relative movement therebetween in response to the varying frequency currents. Movement of the core causes movement on the shaft in at least the x-y direction or the rotational direction or combinations thereof.

In a preferred embodiment, the suspending means comprises at least one flat spring or elastic member which flexibly mounts the core with respect to the coil. The spring provides a restoring rotational torque to the core about the axis.

In another embodiment, the device is adapted to receive a first frequency that is a resonant frequency of the mounting means in the rotational direction. It is further adapted to receive a second frequency, a resonant frequency of the mounting means in the x-y direction. It is contemplated that the device would further include frequency mixer means for supplying various frequencies to the coil, and preferably at least the two resonant frequencies to the coil.

In yet another embodiment, a second coil is added. This coil is annularly positioned around the magnetic core and is located in the region of the magnetic field which defines the x and y coordinates. Preferably, the coil is wound around a bobbin device which locates the annular coil between the ring and the magnetic core. Means are provided for introducing electric current into the annular coil.

It is further contemplated that a mirror will be mounted on the axis, and the entire device can be incorporated into a scanner system as desired.

It is further contemplated that another kind of optical element such as a small semi conductor laser device may be directly mounted to the axis and mounted into a scanner system.

In one embodiment, the annular ferromagnetic ring includes a gap in its periphery at a location radially opposite the coil that is wound on the ring. In some instances, the coil may in fact comprise two coils, each of which is wound at a location spaced approximately 90° radially from said gap. In that embodiment, the magnetic core element may be sized to have a length facing the gap and also facing that portion of the ring periphery which is 180° radially from the gap. The core element width is shorter than the length because the two coils extend into the annular space. This generally rectangular shape increase the efficiency of the device.

Finally, in another embodiment, the ring may include a radially inwardly facing ferromagnetic screw which functions as a magnetic damper means. The screw is threaded in the ring to adjustably vary the distance between the radially inwardly facing end of the screw and the core element.

BRIEF DESCRIPTION OF THE DRAWINGS

These and other objects of the present invention and the various features and details of the operation and construction thereof are hereinafter more fully set forth with reference to the accompanying drawings, where:

FIG. 6 is an exploded view of the preferred embodiment of this invention.

FIG. 7 is a cross sectional view of a device of the type shown in FIG. 6, in which the assembled device is sectioned.

FIG. 8 is a cross sectional view of an alternative embodiment of the device shown in FIGS. 6 and 7.

FIG. 13 is an exploded perspective view of yet another embodiment of the present invention.

FIG. 15 is an exploded perspective view of still another embodiment of this invention.

BEST MODE FOR CARRYING OUT THE INVENTION

Figure 1:
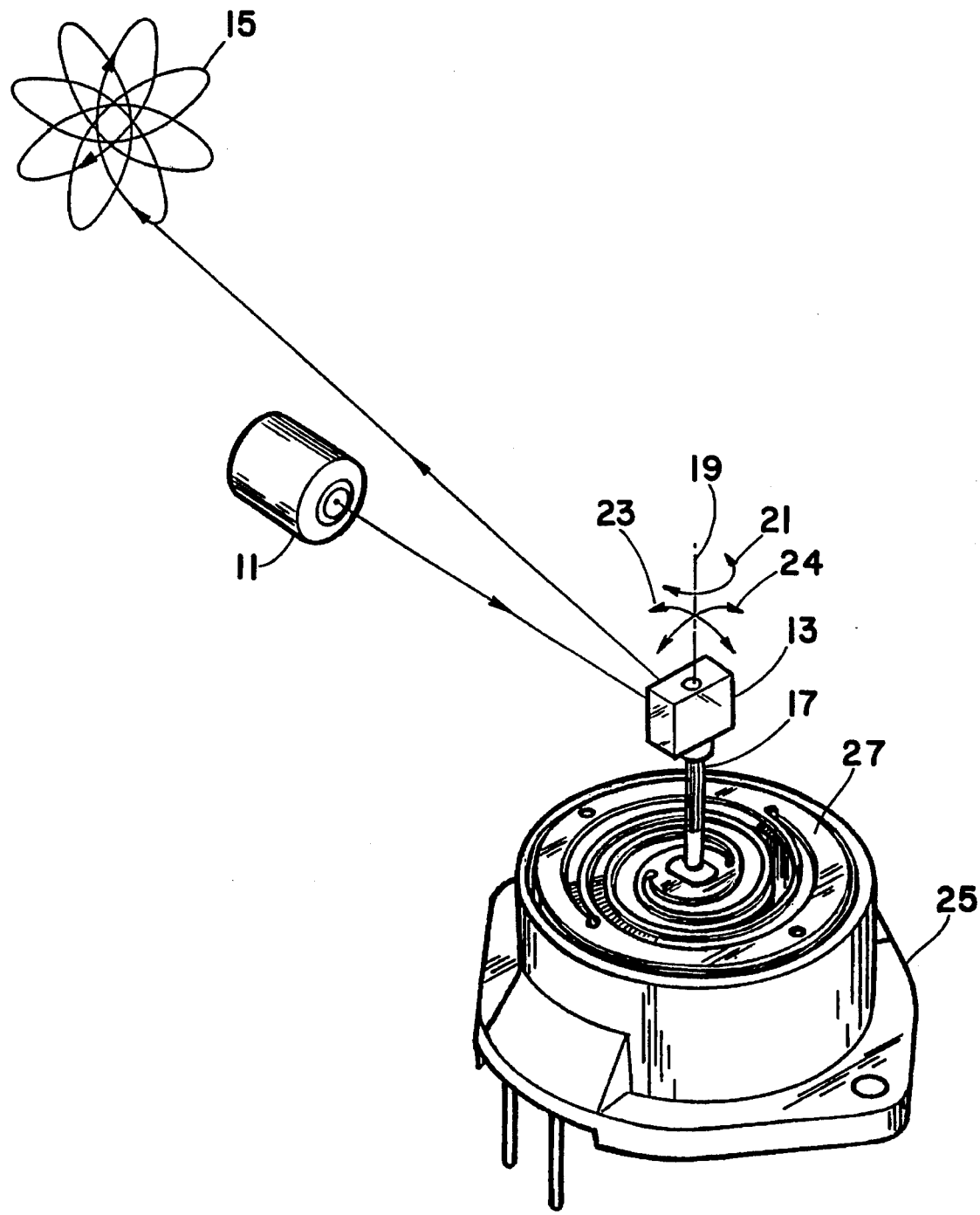
FIG. 1 is a perspective view of one embodiment, shown in combination with a laser source and a mirror, and also shows an output pattern.

As shown in FIG. 1, a laser beam is generated from a laser source 11 and is reflected by mirror 13 which, as will be described below, is moving in at least one or two dimensions to cause a pattern 15 to be reflected off of mirror 13.

While the present invention is admirably suited for use as a scanner with a laser source and the like, those components are not shown. The invention relates to the movement of the axis of a shaft in at least the x-y direction or the rotational direction. Specifically, shaft 17 has axis 19 and is caused by the present invention to rotate in the rotational direction as shown by arrow 21 and in the x-y plane as shown by arrows 23 and 24.

Shaft 17 causes mirror 13 to move in the rotational direction or the x-y plane by the magnetic rotor and coil arrangement contained in frame 25. The position of the magnet is restored by spring 27 as the magnet moves due to interaction with current in the coil at various frequencies. Ideally, the frequency of the current in the coil will cause rotation in both the rotational direction and the x-y directions. In FIG. 1, a rotating ellipse pattern is shown, but an almost unlimited number of patterns are possible. While spring 27 is preferred in this embodiment, other mounting means for flexibly suspending a core may be used. Of these, flat springs, flexible elastic members, and membranes are preferred.

Figure 2:
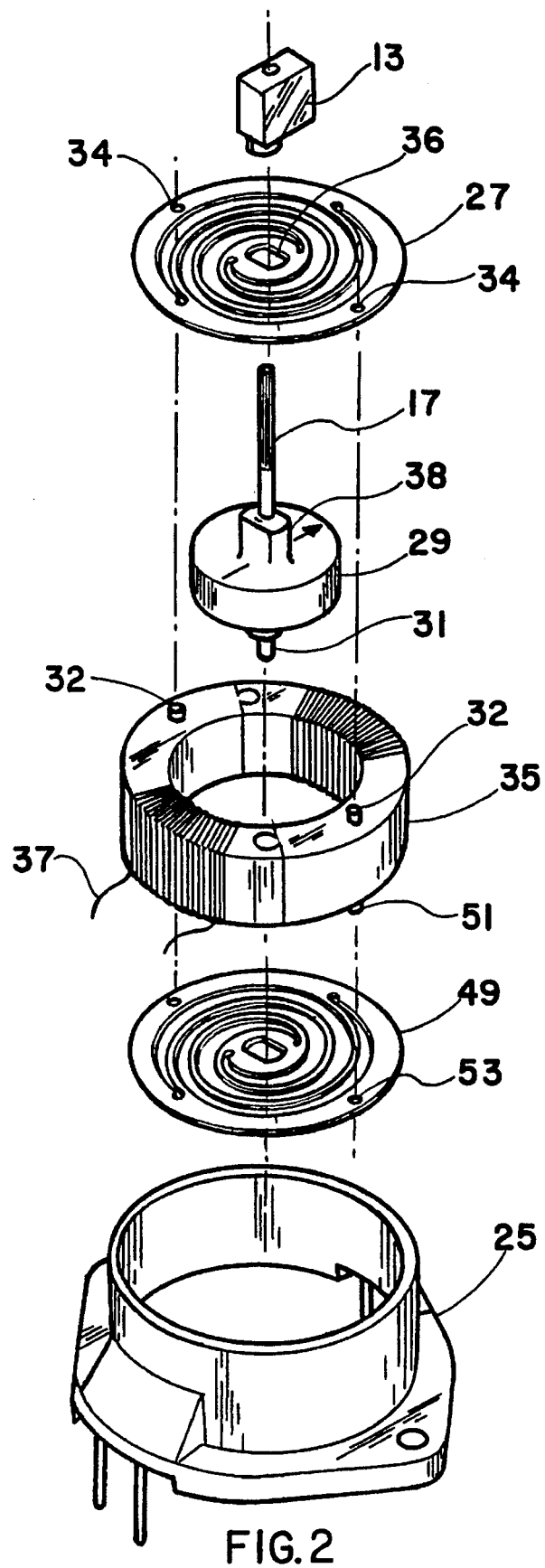
FIG. 2 is an exploded view of a device similar to the device shown in FIG. 1.
Figure 4:
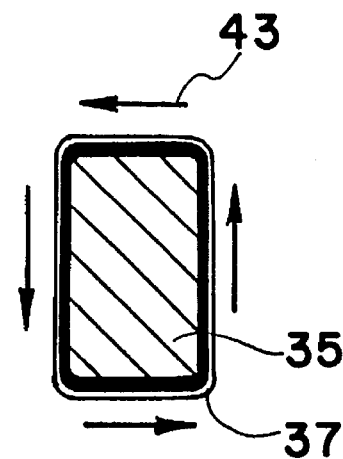
FIG. 4 is a section view taken along line 4—4 of FIG. 3, showing the direction of the current in the coil around the ring.

Turning now to FIG. 2, a device similar to that of FIG. 1 is shown. The device is shown with its major components on an axially exploded view. Mounted on the shaft 17 is a magnet 29, with arrow 30 pointing in the direction of magnetization.

Figure 5:
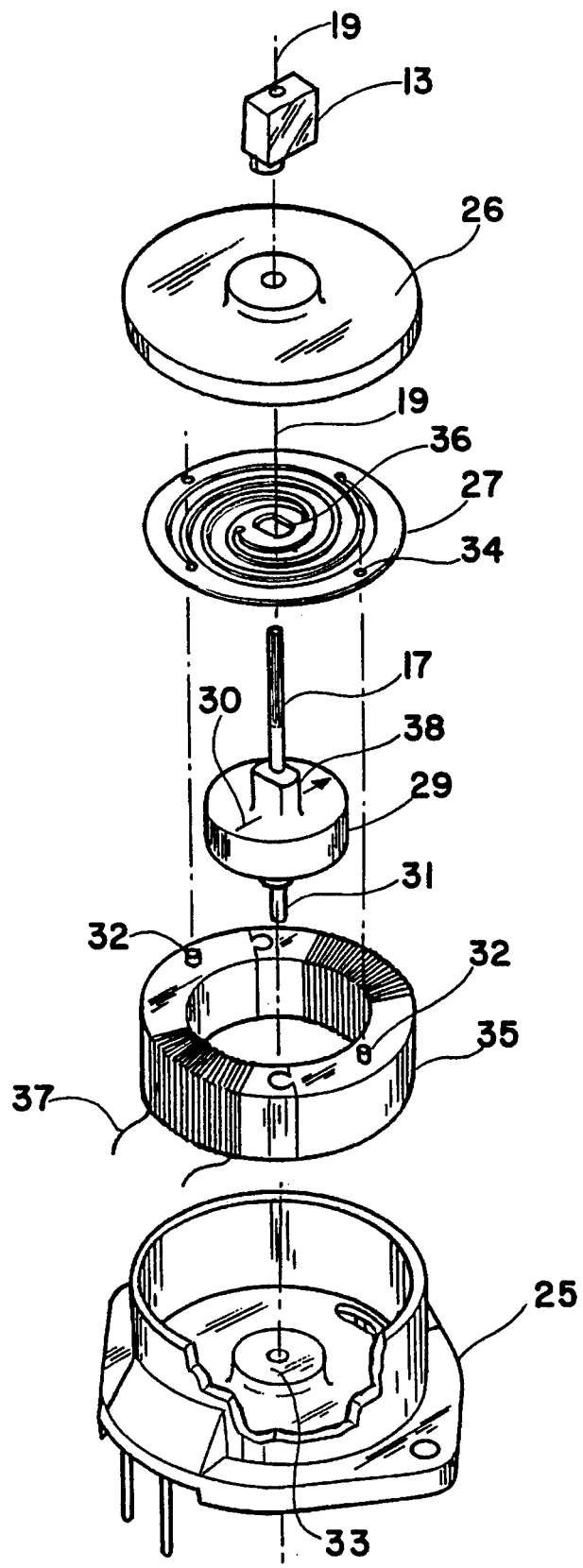
FIG. 5 is an exploded perspective view of another simpler embodiment of the present invention.

The lower end 31 of shaft 17 is supported in the base frame 25 such as shown in FIG. 5. Positioned radially from the magnet 29 is a toridal ring 35 which includes at least one winding 37, so that the ring 35 functions as a coil for cooperative action with magnet 29. Spring 27 is mounted on ring 35 through a pair of posts 32 which fit into holes 34 in the spring. The interior portion of spring 27 has a shaped slot 36 which fits over the central cooperative member 38 of magnet 29. Thus movement of magnet 29 with respect to core ring 35 will cause a restoring force in spring 27, as post 32 and hole 34 restrains movement of the spring while shaped slot 36 and central core 38 cause the inner portion of spring 27 to move with magnet 29.

Figure 3:
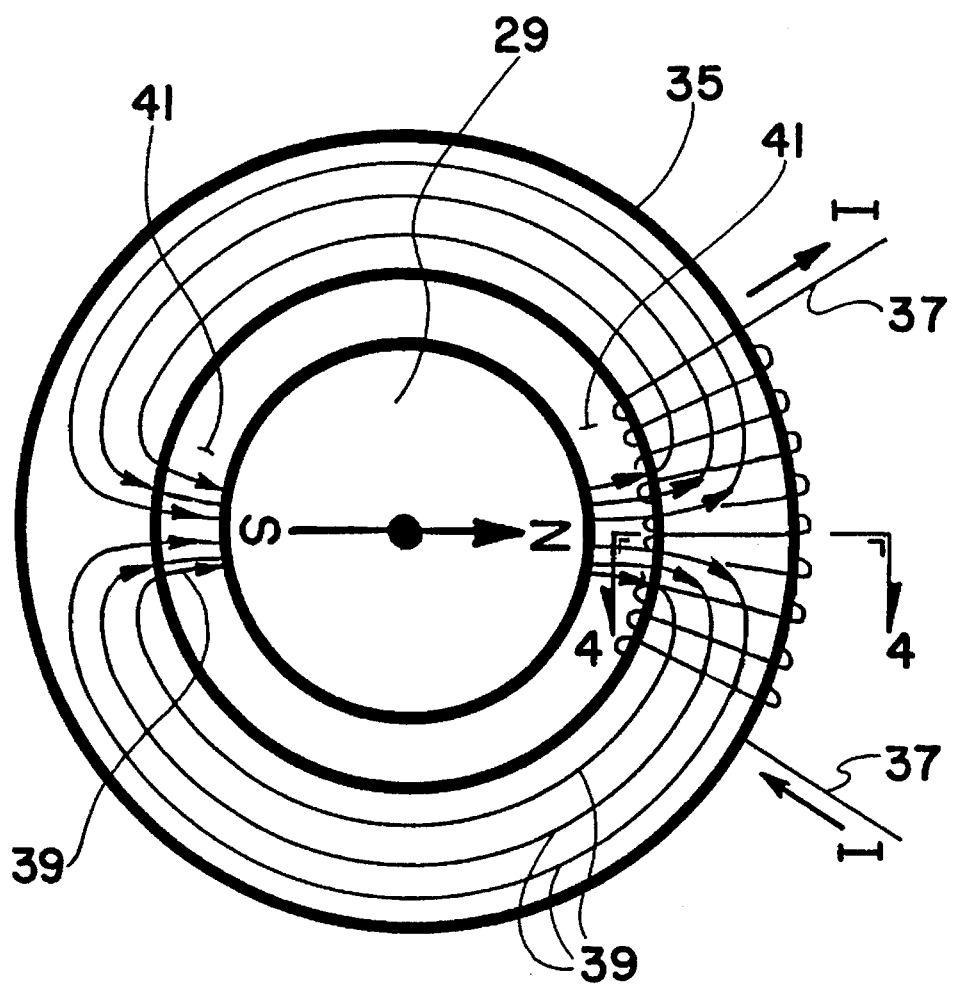
FIG. 3 is a schematic view of a preferred driving mechanism showing magnetic field lines of force for a ring and magnetic core of the device shown in FIG. 1.

Turning now to FIG. 3, the magnet 29 is shown with a north and south pole, generating a magnetic field of flux 39 so that ferromagnetic ring 35 provides a low reluctance path for field 39 from the north pole to the south pole. Flux lines 39 pass through the gap 41 between the magnet core 29 and the ferromagnetic ring 35 and also interact with current conducted by winding 37.

When current is passed through winding 37, the direction of the current on the portion of the winding 37 around the outside of torrid ring 35 will be opposite that of the current direction on the inside wall of ring 35. Note that the field 39 does not pass through the part of windings 37 on the outside diameter of ferromagnetic ring 35 making possible a torque to be generated between the magnetic core and the winding. The magnetic field produced by this winding 37 will also be contained and directed by the ferromagnetic material of ring 35. Current in coil 37 is not allowed to reach a level which would cause core 35 to reach a state of magnetic saturation.

When permanent magnet rotor 29 is introduced into the center of ring 35, its field will pass through the air gap 41 and enter the inside wall of ring 35. The field 39 will then be directed as shown by the arrows around the circumference and returned through the air gap near the opposite pole of the magnet, thereby finally completing its path. The field of the permanent magnet 29 does not substantially penetrate beyond the outer wall of the ring 35. If the magnetic field of magnet 29 penetrated the outer wall of ring 35, and thus through the outside coil windings 37, deflection forces would cancel and the rotor 29 would experience no torque. However, since the magnetic material or low reluctance path of ring 35 directs and contains the magnetic field 39 of magnet 29, and shields coil windings 37 passing up the outside wall of the ring 35, from the field of magnet 29, the magnetic field of magnet 29 passes only through one side of the winding. When a current carrying conductor is placed in a magnetic field which is perpendicular to the direction of the current, a force between the current and the field is produced which is mutually perpendicular to both the direction of the current and the magnetic field. Thus, as shown in FIG. 3, a force will be produced between a field 39 and the current in coil 37. As a result, magnet 29 will experience a torque which causes it to rotate. This torque is proportional to the number of turns of wire, the current carried by the coil, and the magnitude of the magnetic flux from the magnet penetrating the inside portion of the winding. Introduction of an alternating current in coil 37 will cause magnet 29 to oscillate.

Turning back to FIG. 2, it is noted that the magnet 29 is fitted through the central portion 38 of magnet 29 to the shaped slot 36 on spring 27, thus, as magnet 29 moves or vibrates about axis 19 of shaft 17, spring 27 opposes that motion. When an alternating current is introduced in coil 37, at a resonant frequency, in the rotation direction for spring 27, movement of the mirror 13 is caused to occur in the rotational direction. Similarly, when the current in coil 37 is at a frequency at or near the resonant frequency for movement of spring 27 in the x-y plane, movement in that direction is also achieved. Notice that mirror 13 is shown with its mounting hole for shaft 17 off center thereby creating a slightly unbalanced load for shaft 17. Said unbalanced load acts to aid the initiation of and to sustain oscillating motion in the x-y dimensions when appropriate resonance frequencies are introduced into coil 37 for those modes of oscillation.

In another preferred embodiment, shown in FIG. 2, a second spring 49 is also mounted with post 51 through holes 53 in the same manner as spring 27 is supported by holes 34 on posts 32. Thus, excitation of the magnet 29 by current in coil 37, as previously described will be resisted by both spring 27 and spring 49 to provide the restoring forces necessary for oscillation. Selection of suitable frequencies of the current to be resonant with springs 27 and 49 will allow even greater variety in the ultimate movement of the mirror 13 in both the rotational direction and the x-y plane.

FIG. 6 shows the preferred embodiment of this invention, in which the first coil 37 and ring 35 is augmented with a second coil. An annular coil 45 is wound around bobbin 47, so as to present an annular winding in the plane of the magnetic field of magnetic core 29. Bobbin 47 is sized to fit in space 41 shown empty in FIG. 3 and filled with bobbin 47 in FIG. 7.

The second coil, annular coil 45, is also connected to an electric current source, not shown, so that a varied current can be introduced into coil 45. Again, various frequencies and wave forms will cause relative movement between magnetic core 29 and bobbin 47, primarily but not exclusively in the x and y plane.

When both the first coil 37 and annular coil 45 are energized with current at various independent frequencies the magnetic core 29 may be made to move in combinations of rotational and x-y directions which are not resonant frequencies of the system. This feature of the invention makes this embodiment even more versatile.

It is contemplated that the annular coil 45 may be the only coil associated with the device of this invention in at least one embodiment. Thus coil 37 would not be present in the device of FIG. 6, although ring 35 or some other support member would be needed to hold bobbin 47 in place. In this manner, core 29, which is suspended by springs 27 and 49 will cause mirror 13 to oscillate as previously described.

In FIG. 7, a complete assembly is shown with both coil 37 and coil 45 in place. This assembly optimizes the ability to provide movement to a mirror or other optical device on an axis. Covers 59 and 61 provide protection primarily against excessive deformation of springs 27 and 49 so that they do not exceed their elastic limit.

The device shown in FIG. 7 is configured to move mirror 13 in the manner shown in FIG. 1, where, for example, a laser 11 produces a two dimensional pattern 15 for use as a scanner. FIG. 8 shows substantially the same device except that shaft 17 is eliminated and mirror 67 is placed directly on the center 38 of core 29. In this configuration, a laser beam or other light can be directed toward the device along the axis of the device, rather than generally perpendicular to the axis. This modification permits even greater flexibility in design of a scanning device or any of the many uses for the device of this invention. In both cases, movement is provided on the axis of the device, by current flow in coils which are within the magnetic field of the core to cause relative movement between core and coil or coils as they are suspended by springs and the like.

Figure 9:
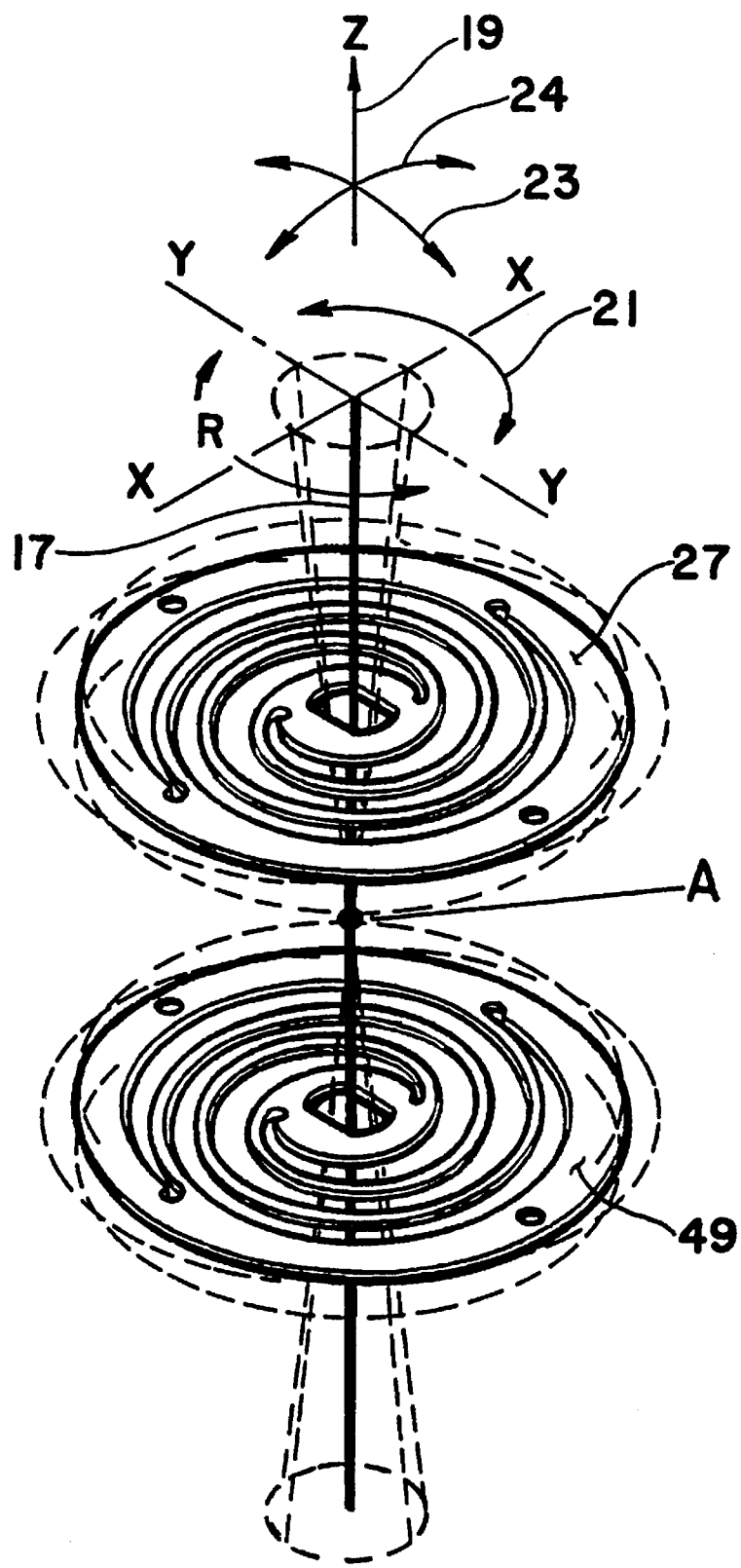
FIG. 9 is a perspective view showing arrangement of the shaft and springs under various forces caused by different frequency current in the coil.

Turning now to FIG. 9, torsion springs 27 and 49 are flat torsion springs with two spirals symmetrically arranged, so that the arrangement has four spring constants. One spring constant is in the z direction, shown along axis 19 while another spring constant is in the rotational direction shown by arrow 21. In addition, there are two spring constants, each in one of the x and y directions. X and y directions are perpendicular to each other, but actually represent angular displacements about the center of shaft 17, or 31, between the two springs at point A, which is midway between the two springs of 27 and 49. Thus, if a mirror is attached to the end of shaft 17, it may be made to execute oscillatory rotations in direction R as well as rocking or precessing motion in the x or y directions. By adjusting parameters of the spring such as stiffness, the number of turns of spirals, overall length of the spirals, and inertia of the mirror shaft system and the like, it is easy to obtain a desired rotational motion caused by the resonant frequency of the assembly in the rotational direction at a particular frequency as well as resonant motions in the x and y dimensions. This resonant rotational frequency can be made several times higher than the resonant frequency for rocking in either the x or y direction. Thus, movement of mirror 13 on shaft 17 will produce a raster like pattern which will retrace itself as long as the current supplied through the windings 37 continues to be at resonances as described herein.

Figure 10:
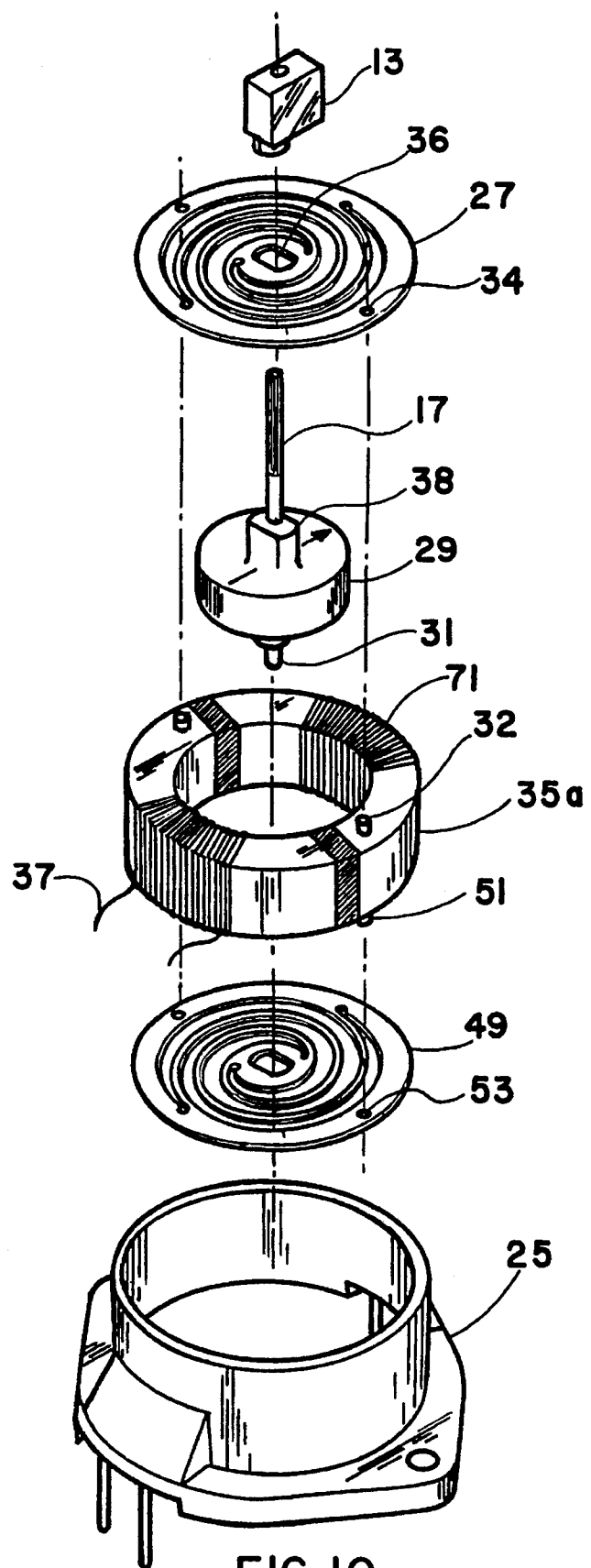
FIG. 10 is an exploded perspective of yet another alternative embodiment of the present invention.

Shown in FIG. 10 is another version of the present invention in which mirror 13 is moved by shaft 17 as a second coil 71 is wound about core 35a. Core 35a includes a non-magnetic spacer which separates two conductive ring halves. When coil 37 is used as a drive coil, second coil 71 will function as a sensor coil. Movement of rotor 29 as previously described will induce a significant back EMF into the second coil 71, and this EMF can be detected. This will allow for feedback control of this drive coil 37 to modify motion of core 29.

Figure 11:
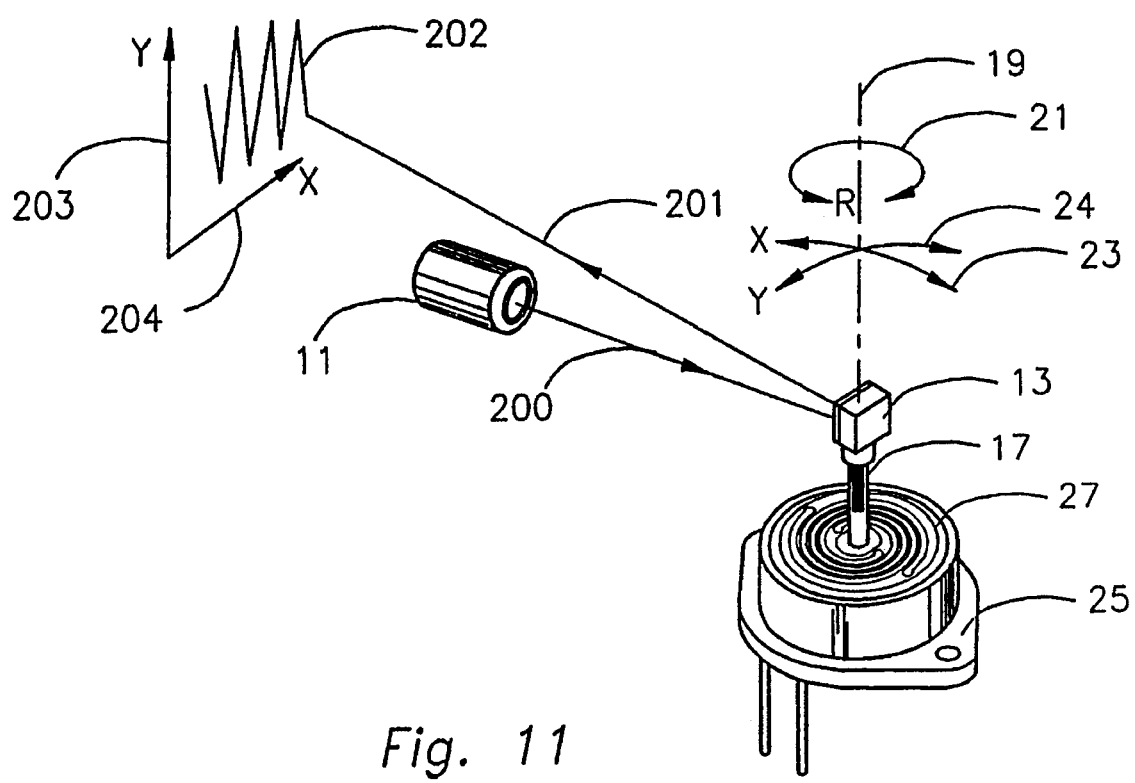
FIG. 11 is a perspective view of another embodiment, shown in combination with a laser source and a mirror, and also shows a two dimensional raster output pattern.

Shown in FIG. 11 is a laser generated pattern which is two dimensional. The pattern is generated by moving mirror 13 in the direction of arc 23 and rotation about Z axis 19 as depicted by arrow 21. By combining both motions and causing the rotational oscillation to be slower than nodding motion or linear motion of mirror 13 in the direction of arc 23, a raster pattern 202 is generated as shown.

Figure 12:
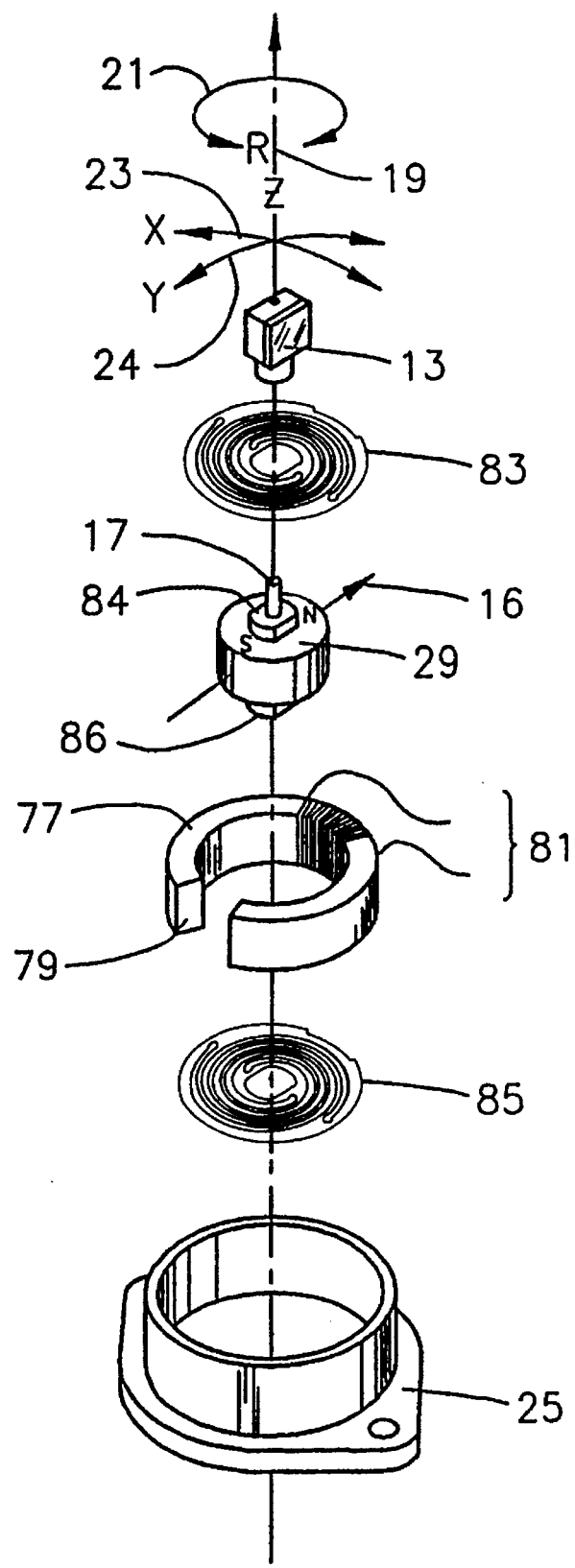
FIG. 12 is an exploded view of a device similar to the device shown in FIG. 11.

Such a pattern can be generated by the device shown in FIG. 12, which is an exploded view of an additional embodiment. The device shown in FIG. 12 includes an annular ring 77 which has a gap 79 and a coil 81 wrapping the periphery of the ring 77 at a point 180° radially from gap 79. Core 29 is suspended between springs 83 and 85 by setting the top 84 and bottom 86 of magnetic core 29 into the center portions of springs 83 and 85 respectively. Core 29 oscillates without contact with ring 77 and thus can move shaft 17 and therefore move mirror 13 in response to frequencies passed through coil 81. When springs 83 and 85 are stiff and an alternating current is introduced into coil 81 at resonant frequency of the mass and the spring combination for movement in a particular direction, such as in the direction of arrow 23, a first motion is achieved to cause reflective beam 201 to trace a vertical pattern along the Y axis 203. The rotational movement causes the reflective beam to provide the component on the X axis 204.

Figure 14:
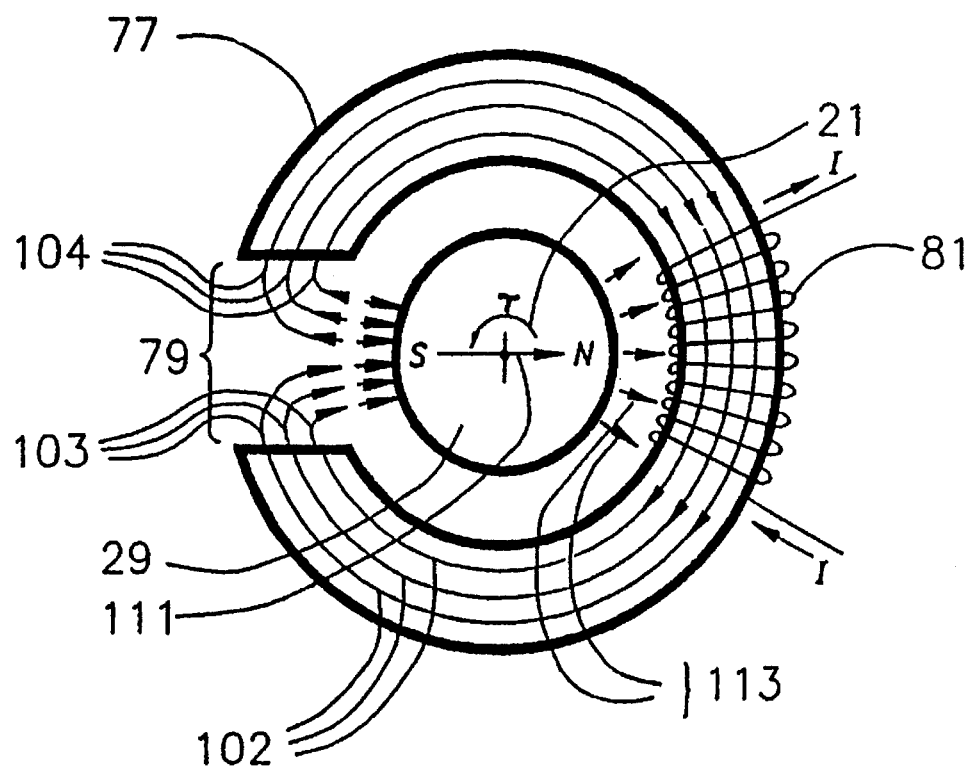
FIG. 14 is a schematic view of a preferred driving mechanism showing magnetic field lines of force for a ring and magnetic core of the device shown in FIG. 13.

Turning now to FIG. 14, a method for generating substantial rotational torque in the core 29 is illustrated as follows. Lines of flux, as typified by arrows 113 emanate from the coil 29 and penetrate coil 81 which is wound about the core 77. When coil 81 is energized with alternating current I, torque will be introduced into the core 29 causing it to oscillate in a rotational direction shown by arrow 21 at the frequency of the alternating current I being supplied. A magnetic field, depicted by lines of flux 102, will be induced in metal core 77. Gap 79 is included in ring 77 such that flux lines 102 emerge from gap 79 as flux lines 103 and 104 to encounter the permanent south pole S of magnetic core 29. A stronger torque is thereby induced in core 29 compared to that generated by the simple interaction of the field from core 29 and coil 81. Thus, as alternating current I is introduced into coil 81, the strong torque brought about by the use of gap 79 permits rotation of the core 29 at a frequency well below resonance for rotational motion and at large angles which may be on the order of 30°. Thus, if a high frequency current at the proper resonance frequency is applied to the coil 81 along with a low frequency alternating current of sufficient magnitude, the raster scan patter 102 shown in FIG. 11 will be generated.

Another embodiment similar to that shown in FIG. 12 is shown in FIG. 13. In this design, a single spring 83 is used to flexibly support core 29 on shaft 17. The top and bottom portions of shaft 17 are supported in bearings 87 and 89, which are located in plates 88 and 90 respectively. Use of bearings 87 and 89 prevent motion in any of the axes previously described, thereby allowing only rotational movement about axis 19 in the direction of dual arrow 21.

Figure 16:
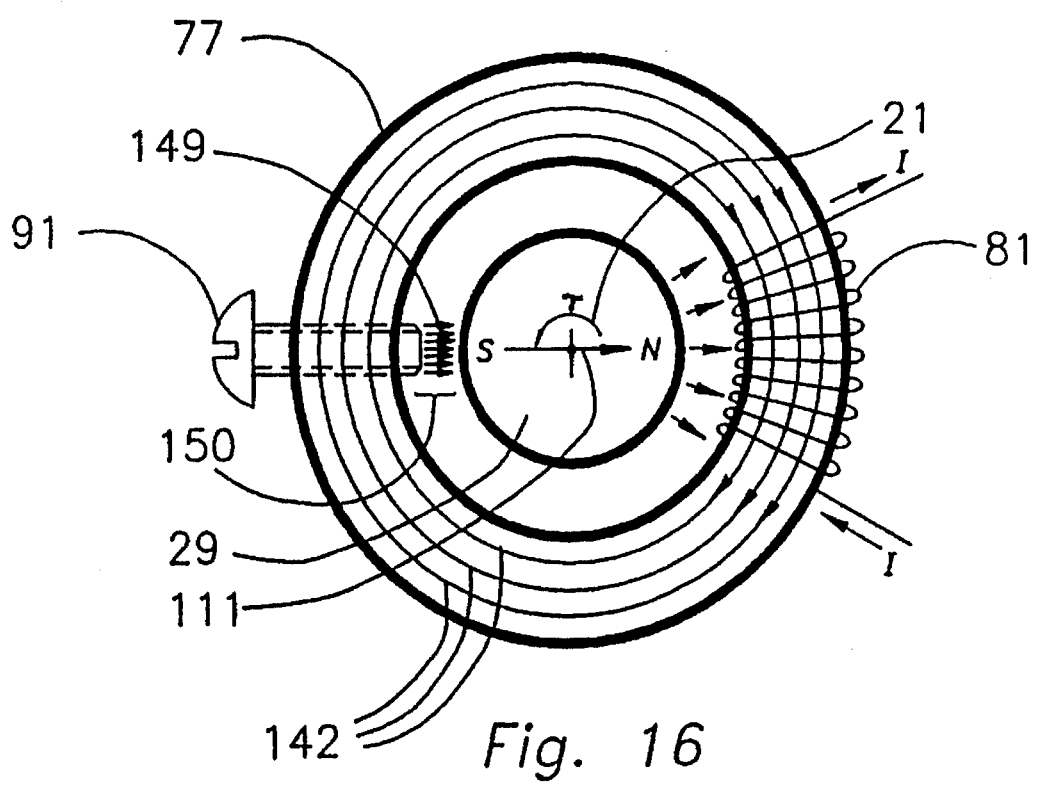
FIG. 16 is a schematic view of the device shown in FIG. 15, showing magnetic field lines of force for that ring and core.

Torque forces in the device shown in FIG. 13 are again illustrated in FIG. 14. The gap 79 of ring 77 cooperates with coil 81 to produce a torque about the Z axis 19. As current I in coil 81 is an alternating current, movement in the direction of arrow 21 is in both clockwise and counterclockwise directions about axis 19. A different embodiment is shown in FIG. 15 when it is necessary to increase the torque and damper resonant frequencies. Instead of a gap, ring 77 includes a radially inwardly facing ferromagnetic screw 91 which is threaded to adjustably vary the distance between the screw and the core 29. FIG. 15 shows the device in an exploded position with the shaft 17 supported by bearings 87 and 89, in bearing plates 88 and 90 as previously described. Spring 83 allows for reaction to torque which is induced in core 29. In FIG. 16, the flux lines 142 encounter the south pole S of core 29 as shown by arrows 149. Since screw 91 is threaded to adjustably vary the gap 150 between the screw 91 and the core 29, the induction of a torque on core 29 can be varied. Maximization of the torque at a particular frequency requires a balancing of the current I in coil 81 and the gap 150 between core 29 screw 91. Also, as gap 150 is closed, resonant motion which may produce unwanted overshoot of rotational motion upon starting the device may be dampened and thereby reduced.

Figure 17:
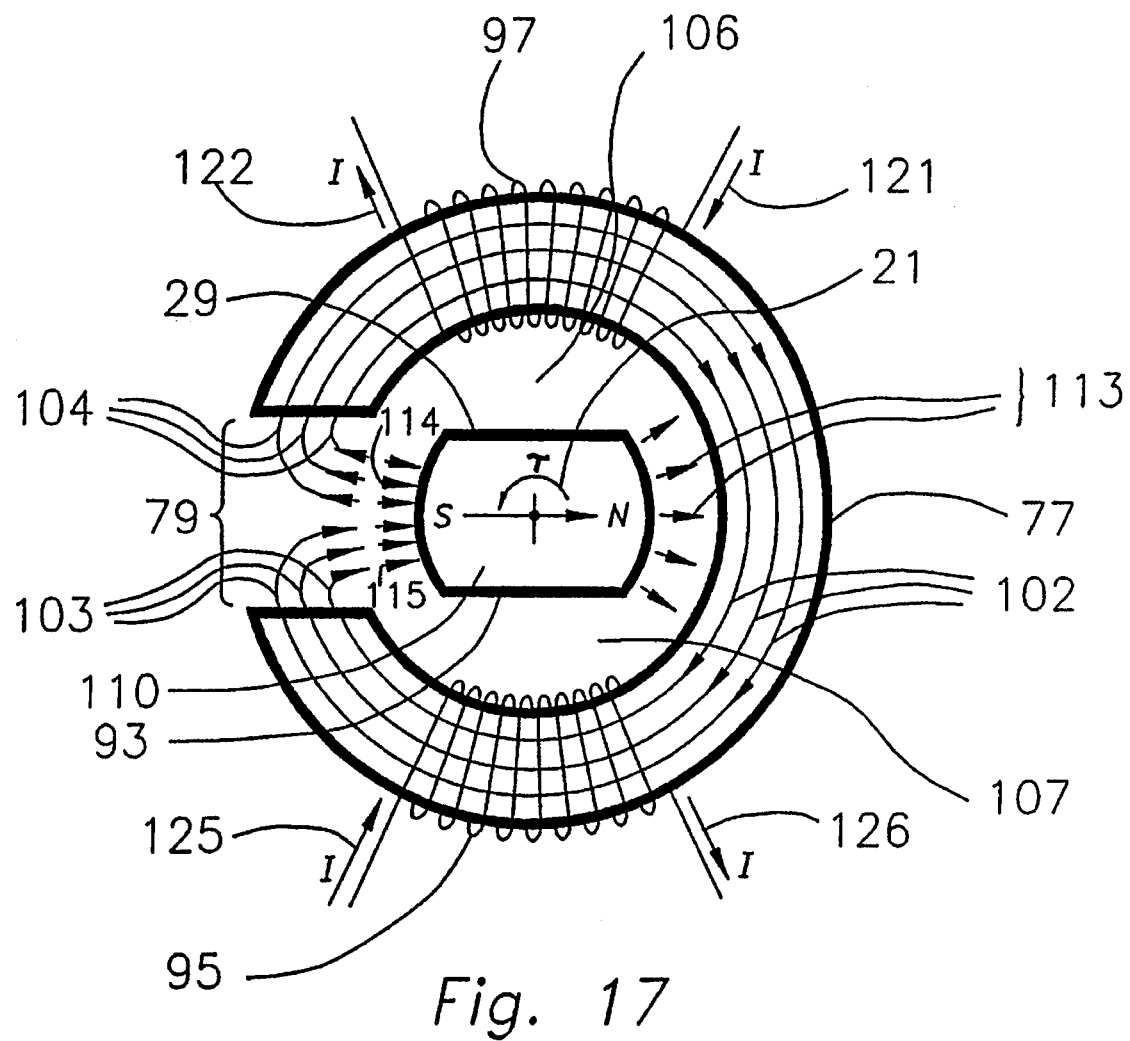
FIG. 17 is an enlarged schematic view of a device similar to that shown in FIG. 13, showing yet another embodiment and the magnetic field lines of force for that device.

Shown in FIG. 17 is yet an another embodiment of the present invention which provides for increased torque about the Z axis as shown by arrow 21. In this embodiment core 29 has flat faces 93 to provide space for coil 95 and 97 in areas generally shown at 106 and 107. Thus, the south pole S of core 29 can be closer to gap 79 and the North Pole N closer to the ferromagnetic ring 77 so that an increased torque is again achieved.

Figure 18:
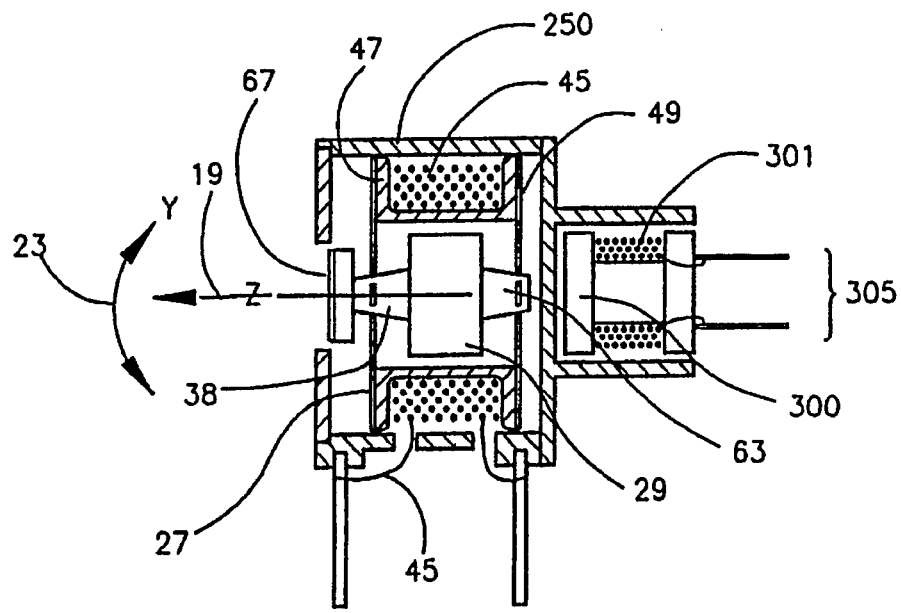
FIG. 18 is a cross-sectional view of a device which permits compact mounting and can produce large rasters or other two dimensional scans.

Shown in FIG. 18 is yet another embodiment of the present invention which may be driven at a frequency well below resonance and yet is able to execute large X or Y displacements on the order of 30 degrees. This capability is well suited to generation of raster patterns and the device is amenable to extremely compact mounting on the surface of a printed circuit board.

The device shown in FIG. 18 includes a solenoid coil 301 wrapped about a ferromagnetic core 300 shaped like a dumbbell. The core 300 is used to increase the strength of the magnetic field produced by coil 301.

Figure 19:
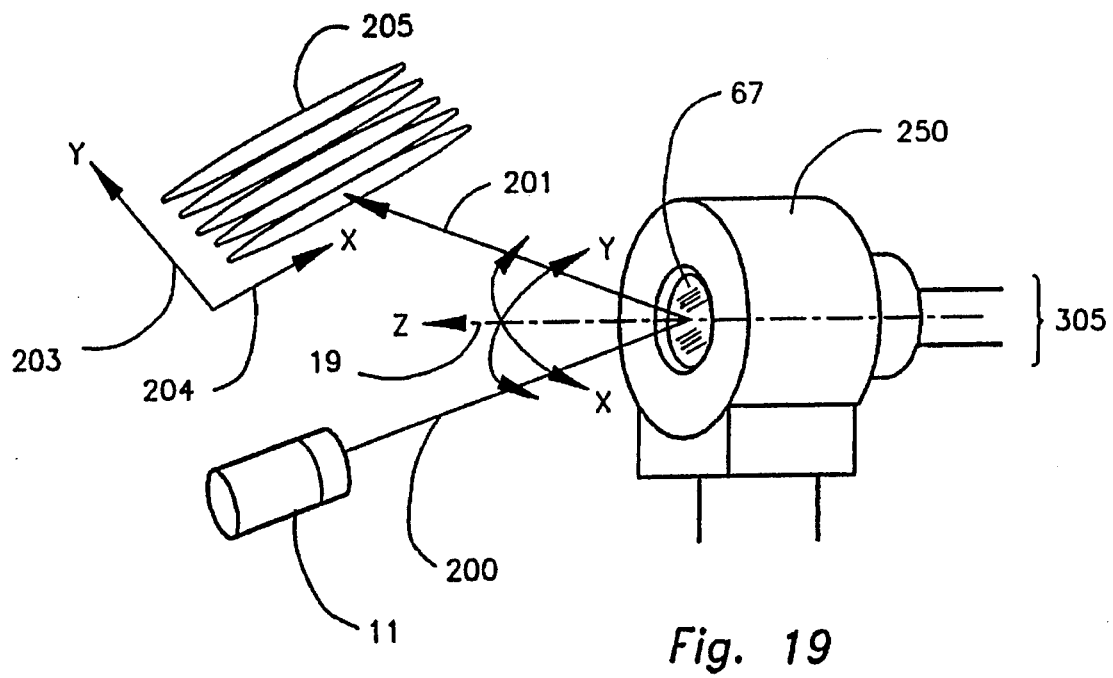
FIG. 19 is a view of a device similar to that of FIG. 18 showing a sample scan pattern.

When coil 301 is energized with alternating current, core element 29 will be caused to execute oscillating displacements as indicated by double arrow 23. These displacements may be made using large and very low frequency as compared to the natural resonant frequency for such motion due to the intense field produced by coil 301. At the same time, if a resonant frequency for motion in another direction which is relatively high is superimposed on the low frequency applied to coil 301 or it is applied to annular coil 45, a raster pattern or some other two dimensional patten may be generated. Such a pattern is illustrated in FIG. 19.

Figure 20:
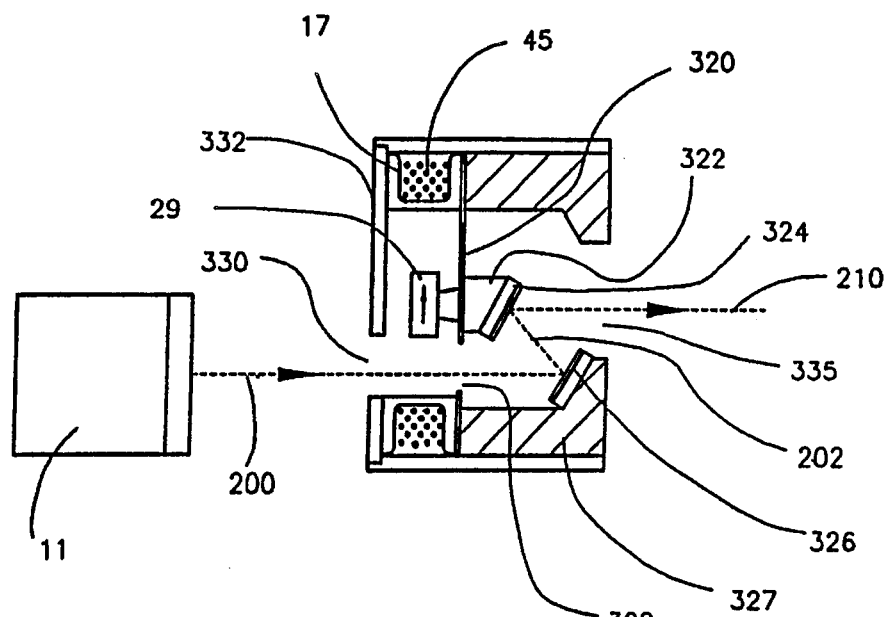
FIG. 20 is a cross-sectional view of the present invention which allows a beam of light to enter one end of the device and produces a scanned beam which exits the opposite end of the device.
Figure 21:
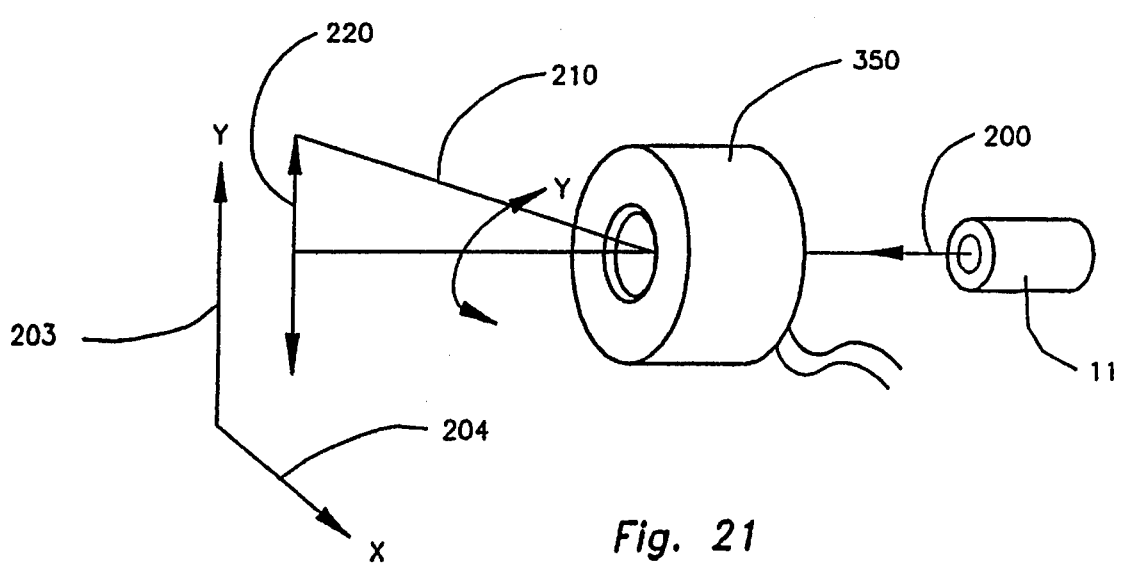
FIG. 21 is a view of the device of FIG. 20 showing how it may be arranged for a compact in-line scan system.

FIG. 20 illustrates a device which can accept an input light beam 200 and cause it to be scanned so that the scanned beam 210 emerges from it traveling generally in the same direction as the light that entered it. With this device it is possible to linearly arrange a light source 11 with the scan device 350 in line with outgoing beam 210 as shown in FIG. 21 and thereby greatly simplify the optical layout of a scanner. In addition this arrangement can be built into an extremely compact and narrow enclosure such as a cylindrical tube on the order of only one half inch in diameter.

In the operation of the device of FIG. 20 a light beam 200 from light source 11 enters aperture 330 and passes through an opening 328 in suspension 320 whereupon the beam is reflected by a first fixed mirror 326. After reflection by mirror 326, the beam travels along path 202 and is again reflected by a second moveable mirror 324 and emerges along path 210 from the device passing through aperture 335. Note that the input beam 200 is generally parallel to and moves in the same direction as the output beam 210 except that beam 210 is scanning about that direction.

Scanning is achieved when magnetic core 29, attached to flexible suspension 320 is set in motion by applying alternating current to coil 45 and moveable mirror 325 participates in the motion of core 29 thereby causing outgoing beam 210 to scan.

Moveable mirror is shown mounted on a wedge 322 and stationary mirror 326 is fixed to the body 327 of the device at an angle so that the reflective surfaces of both mirrors 324 and 326 face each other and are parallel. This is considered the best embodiment but modifications are possible. Also the device can be operated in reverse by first reflecting an input beam from the moveable mirror 324 in which case the output beam would then emerge from aperture 330 after reflection from fixed mirror 326.

By driving coil 45 of the device of FIG. 20 with an appropriate mix of frequencies it is possible to generated two dimensional scan patterns as is accomplished in other embodiments of the present invention.

While particular embodiments of the present invention have been illustrated and described herein, it is not intended to limit the invention and changes and modifications may be made therein within the scope of the following claims.

What is claimed is:

1. A device for providing angular displacement of a core with respect to an axis defined by said core, comprising;

a magnetic core element for producing a magnetic field, and defining a Z axis, said core element adapted for at least two movements selected from the group consisting of angular displacement in the X direction, angular displacement in the Y direction, and rotation about the Z axis;

coil means proximate said core element for introducing a distortion force in said core element in at least one of said X and Y directions or rotation about the Z direction as desired; and mounting means for suspending said core element with respect to said coil means to permit relative movement therebetween in response to said distortion force.

2. The device of claim 1, wherein said mounting means comprises a spring mounting one end of said core element and one end of said coil means.

3. The device of claim 2 which includes an opening for light to enter one end of said device;

a first mirror mounted to the device and stationary with respect to said coil;

a second mirror mounted to move in response to movement of said core element; and an exit opening for a scanned beam of light to exit said device.

4. The device of claim 3, wherein said second mirror is mounted on a wedge shaped mount and generally parallel to said first fixed mirror permitting a beam which enters the device to be reflected from said second moveable mirror and exit the device as a scanned beam proceeding forward in the same general direction as the input beam.

5. The device of claim 4, wherein the device is configured to cause the input beam to first reflect from said moveable mirror then from said fixed mirror.

6. The device of claim 3, wherein said second mirror is mounted generally parallel to said first mirror permitting a beam which enters the device to be reflected from said second movable mirror and to exit the device as a scanned beam proceeding forward in the same general direction as the input beam.

7. The device of claim 1, wherein said mounting means comprises a pair of springs each mounting one end of said core element and one end of said coil means.

8. The device claim 1, wherein said core element includes an axial mount aligned along said Z axis and positioned to move in response to movement of said core element.

9. The device of claim 8, wherein said axial mount includes a mirror mounted thereon for movement in response to said distortion force.

10. The device of claim 9, wherein said mirror is aligned in a plane generally perpendicular to said Z axis.

11. The device of claim 10, wherein a solenoid coil is attached at one end of said core element.

12. The device of claim 11, wherein said solenoid coil is wound on a ferromagnetic core.

13. The device of claim 9, wherein said mirror is aligned in a plane generally parallel to said Z axis.

14. The device of claim 1, which further includes a ferromagnetic ring surrounding said core element and said coil means includes a coil wound around a portion of the periphery of said ring.

15. The device of claim 14, wherein said ferromagnetic ring has at least one bearing plate mounted on one end of said ring, said core including an axial mount aligned along said Z axis and positioned to move in response to movement of said core, said mount being journaled in said bearing plate to restrict movement of said mount to rotational movement about said Z axis.

16. The device of claim 15, wherein said ferromagnetic ring includes a second bearing plate mounted on the opposite end of said ferromagnetic ring to said first bearing plate, said mount also being journaled in said second bearing plate to further restrict angular displacement of said axis to rotation in said Z axis.

17. The device of claim 14, wherein said mounting means comprises at least one pair of springs each mounted at opposite ends of said magnetic core.

18. The device of claim 1, wherein said coil means includes a generally annular coil surrounding said Z axis and spaced from said core element.

19. The device of claim 1, which further includes a ferromagnetic ring surrounding said coil element and spaced from said core element to define a generally annular gap, and said coil means includes a first generally annular coil surrounding said Z axis and mounted in said annular gap.

20. The device of claim 19, which further includes a second coil around a portion of the periphery of said ring.

21. The device of claim 20, wherein said magnetic field substantially penetrates only one side of said second coil.

22. The device of claim 20 wherein, said mounting means comprises at least one pair of springs each mounted at opposite ends of said magnetic core.

23. A device for providing angular displacement of a core with respect to an axis defined by said core, comprising:

a magnetic core element for producing a magnetic field, and defining a Z axis, said core element adapted for at least two movements selected from the group consisting of angular displacement in the X direction, angular displacement in the Y direction, and rotation about the Z axis;

a ferromagnetic ring surrounding at least a portion of said core element to produce a distortion force in at least one of said X and Y directions or about the Z axis as desired, said ring including a coil wound around a portion of the periphery thereof; and mounting means for suspending said core element with respect to said coil means to permit relative movement therebetween in response to said distortion force.

24. The device of claim 23, wherein said ring comprises a generally annular ring centered on said axis.

25. The device of claim 23, wherein said ring comprises a generally annular ring centered on said axis and having a gap in its periphery at a location radially opposite said coil.

26. The device of claim 23, wherein said ring comprises a generally annular ring centered on said axis and having a gap in its periphery and said coil comprises two coils wound on the periphery of said ring and each spaced approximately 90° radially from said gap.

27. The device of claim 26, wherein said magnetic core element is sized to have a length facing said gap and a width shorter than said length facing said periphery of said ring to provide increased spacing between said element and said ring proximate said two coils.

28. The device of claim 23, wherein said ring includes a magnetic damper means for reducing generally the annular gap between said ring and said core element at a point about 180° radially from said coil.

29. The device of claim 28, wherein said magnetic damper means includes a radially inwardly facing screw threaded to adjustably vary the distance between said screw and said coil.

* * * * *